United States Patent
Yadav et al.

(10) Patent No.: US 12,306,652 B2
(45) Date of Patent: May 20, 2025

(54) SYSTEM ON A CHIP (SOC) HAVING A LOW POWER MODE OF OPERATION

(71) Applicant: NXP USA, Inc., Austin, TX (US)

(72) Inventors: Vivek Kumar Yadav, Austin, TX (US); Kushagra Khorwal, Austin, TX (US); Joseph Rollin Wright, Round Rock, TX (US); Kumar Abhishek, Bee Cave, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/484,632

(22) Filed: Oct. 11, 2023

(65) Prior Publication Data

US 2025/0123648 A1    Apr. 17, 2025

(51) Int. Cl.
| | |
|---|---|
| *H03K 19/0175* | (2006.01) |
| *G05F 1/59* | (2006.01) |
| *G06F 1/26* | (2006.01) |
| *H03K 3/037* | (2006.01) |
| *H03K 19/20* | (2006.01) |

(52) U.S. Cl.
CPC ............. *G05F 1/59* (2013.01); *G06F 1/263* (2013.01); *H03K 3/037* (2013.01); *H03K 19/20* (2013.01)

(58) Field of Classification Search
CPC ............ H03K 3/037; H03K 19/0175; H03K 19/017545; H03K 19/173; H03K 19/1733; H03K 19/20; G05F 1/59; G06F 1/26; G06F 1/263
See application file for complete search history.

(56) References Cited

U.S. PATENT DOCUMENTS

| | | | |
|---|---|---|---|
| 8,648,654 B1 | 2/2014 | Myers et al. | |
| 9,772,668 B1 | 9/2017 | Soebroto et al. | |
| 10,983,851 B1 | 4/2021 | Djadi | |
| 11,119,153 B1 | 9/2021 | Srinivasan | |
| 11,994,888 B2 * | 5/2024 | Abhishek | G06F 1/26 |
| 12,124,309 B2 * | 10/2024 | Abhishek | G06F 1/30 |
| 2015/0303900 A1 | 10/2015 | Wang et al. | |
| 2023/0102099 A1 | 3/2023 | Raju et al. | |

\* cited by examiner

*Primary Examiner* — Long Nguyen
(74) *Attorney, Agent, or Firm* — Joanna G. Geld

(57) ABSTRACT

In an integrated circuit, a first always on (AON) domain generates an isolation signal to enter standby mode. A switchable power domain propagates the isolation signal. A voltage level detector outputs an indicator which indicates whether a voltage of the switchable power supply is above or below a voltage threshold. An isolation wrapper circuit includes a pass-through latch selectively enabled based on the output of the voltage level detector. The pass-through latch receives the propagated isolation signal and provides a value of the propagated isolation signal at its output while enabled, but maintains a latched value at its output, regardless of changes in value of the propagated isolation signal, while disabled. The wrapper circuit also includes an isolation circuit which receives signals from circuitry within the switchable power domain and selectively isolates the received signals from a second AON power domain based on the output of the pass-through latch.

20 Claims, 5 Drawing Sheets

SYSTEM ON A CHIP (SOC) HAVING A LOW POWER MODE OF OPERATION

BACKGROUND

Field

This disclosure relates generally to integrated circuits, and more specifically, to a system on a chip (SoC) having a low power mode of operation.

Related Art

As systems become increasingly complex, SoCs are requiring an increasing amount of logic on the die in order to support multiple applications. Therefore, in many instances, a sub-system architecture is utilized in which the SoC is divided into sub-systems based, for example, on the physical placement of logic on the die. Typically, an SoC includes always on (AON) domains which are often distributed across multiple sub-systems of the SoC, each AON domain receiving an AON power supply. An SoC also includes switchable domains, each receiving a switchable power supply which can be powered down during a low power mode to reduce power consumption by the SoC. The main controller responsible for entry into and exit from standby mode is located within one of the AON domains and must send isolation signals to other AON domains for indicating entry into and exit from standby mode. However, these isolation signals are problematic because the AON domains can be located far from each other, and the isolation signals may even need to route through switchable domains which lose power during standby modes.

Traditional solutions for routing these isolation signals include the use of buffers which operate with the AON power supply. For example, in some SoCs, buffers are placed in AON domain islands along the path of the isolation signals. However, this results in increased area, and is not effective when routing distances become too long (e.g. greater than 2000 um). Alternatively, some SoCs use AON buffers designed as standard cells which receive both an AON power supply and switchable power supply, but this solution requires that the AON power grid run parallel to the switchable power grid throughout the chip, which results in a large area impact. In yet other SoCs, super buffers (i.e. large buffers sufficient to drive signals over larger distances without intermediate buffers) are used to route signals over the middle of the SoC using top metal routing resources. However, such buffers require a lot of area and the signals are susceptible to noise from power/ground shields.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
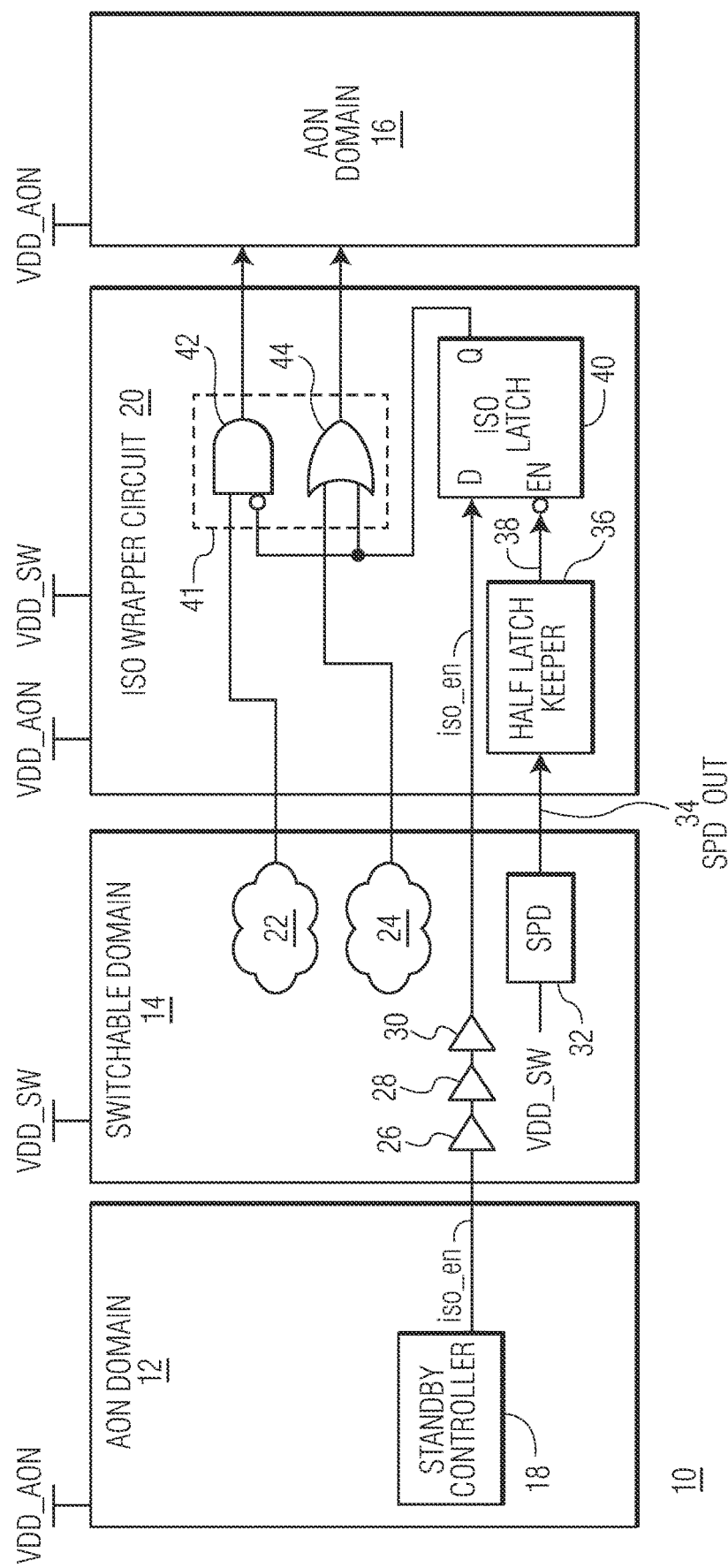
FIG. 1 illustrates, in block diagram form, an SoC having AON domains and having a switchable domain with a voltage level detector, in accordance with an embodiment of the present invention.

In one aspect, an SoC includes multiple distributed always on (AON) power domains and multiple switchable power domains, in which at least one AON power domain includes a standby controller which controls entry into and exit from a standby mode. An AON power domain, also referred to as an AON domain, is configured to receive an AON power supply (also referred to as a continuous power supply), while a switchable power domain is configured to receive a switchable power supply which can be powered down during standby mode. As used herein, a standby mode can be any low power mode in which one or more switchable power supplies provided to the switchable power domains are powered down. The standby controller is configured to provide isolation signals (also referred to as isolation enable signals) to the switchable domains and to other AON domains in order to properly enter standby mode or exit standby mode. In one aspect, a voltage level detector powered by either a switchable power supply or an AON power supply is used to generate an isolation signal for use by isolation circuitry which is configured to isolate an AON domain during standby mode. In another aspect, isolation signals are routed via a portion of a padring of the SoC in order to provide the isolation signal for use by the isolation circuitry. In this manner, any of these aspects ensure that clean isolation signals (having reduced digital noise along the signal paths) reach the switchable domains and other AON domains (and the isolation circuitry) without requiring additional buffering.

In one embodiment, each switchable domain includes a supply power detector (SPD) coupled to a power supply terminal configured to receive the switchable power supply for the switchable domain. The SPD determines when power is present on the power supply terminal. For example, the SPD may assert an output when it detects a voltage greater than a predetermined voltage threshold on the power supply terminal, thus indicating that power is present on the power supply terminal. In this embodiment, the power supply terminal is configured to receive a switchable power supply from an external power management circuit (e.g. power management circuitry located outside the SoC).

In another embodiment, an AON domain may include a low-voltage detector (LVD) which continuously monitors a switchable power supply provided to a power supply terminal of a switchable power domain. The LVD monitors the switchable power supply and asserts an output when a voltage level of the switchable power supply is greater than a predetermined voltage threshold. The predetermined voltage threshold used by the LVD is set higher than a minimum supply voltage required for logic gates to operate. In this embodiment, the switchable power supplies can be provided by an on-chip power management circuit.

Note that in the above embodiments, the SPD or the LVD can be used as a voltage level detector to properly generate isolation signals. Further details of these embodiments, as well as the embodiments utilizing the padring, are provided with respect to FIGS. 2-6 below.

FIG. 1 illustrates an SoC 10 having AON domains 12 and 16, a switchable domain 14, and an isolation (ISO) wrapper circuit 20, in accordance with one embodiment of the embodiment. AON domain 12 and AON domain 16 are each coupled to a power supply terminal configured to receive an AON power supply, VDD_AON. Switchable domain 14 is coupled to a power supply terminal configured to receive a switchable power supply, VDD_SW. In one embodiment, during operation of SoC 10, when not in standby mode (and thus powered up), VDD_SW provides a same supply voltage as VDD_AON. When in standby mode, though, VDD_SW is powered down while VDD_AON remains continuously powered. Note that, as used herein, the power supply terminals can simply be referred to by the corresponding power supply (e.g. VDD_AON and VDD_SW). Although in the illustrated embodiment of FIG. 1, SoC 10 includes two AON domains and one switchable domain, SoC 10 can include any number and placement of AON and switchable domains. Also, each of the AON domains may also be referred to as standby domains as they remain powered up during standby mode.

In the illustrated embodiment, one of the AON domains, AON domain 12, includes a standby controller 18 which provides one or more isolation signals to other domains and circuitry of SoC 10 (e.g. switchable domain 14, AON domain 16, ISO wrapper circuit 20, etc.). Therefore, AON domain 12 may be referred to as a primary AON domain. The isolation signals refer to any control signal provided by standby controller 18 which controls entry into or exit from standby mode. For example, one of these signals is an isolation enable (iso_en) signal which is asserted so as to isolate any circuits or domains, as needed, for safe entry into standby mode, and is then negated so as to release the isolation for resuming normal operation. However, the one or more isolation signals can include other types of control signals, as needed, for proper entry into and exit from standby mode. For example, the one or more isolation signals can be generated by standby controller 18 through the use of a state machine which controls entry into and exit from standby mode. In the descriptions herein, operation will be described in reference to iso_en, but can apply to any of the isolation signals.

AON domain 12, as well as AON domain 16, can include any circuitry of SoC 10 which requires continuous power, such as circuitry which saves state during low power modes, controls operation of SoC 10, performs safety testing, etc. Switchable domain 14 includes any type of circuitry to perform any type of function, but its power supply is removed during standby mode. As an example, switchable domain 14 includes circuitry 22 and circuitry 24. In one embodiment, each of circuitry 22 and 24 is digital circuitry (e.g. logic), each providing an output which can be communicated to other domains, such as AON domain 16. SoC 10 also includes ISO wrapper circuit 20 coupled between switchable domain 14 and AON domain 16, in which signals from switchable domain 14 are communicated to AON domain 16 via ISO wrapper circuit 20 such that they can properly be isolated from AON domain 16 during standby mode. As will be described further below, ISO wrapper circuit is coupled to receive both VDD_AON and VDD_SW, and operates as a bridge between a switchable domain and an AOM domain. For example, ISO wrapper circuit 20 includes isolation circuitry 41 which receives output signals from switchable domain 14 and, when not in standby mode (in which iso_en from standby controller 18 is negated), communicates the output signals to AON domain 16. However, when in standby mode, isolation circuitry 41 is enabled by assertion of iso_en so as to isolate the output signals from switchable domain 14 from AON domain 16 so that they can no longer affect operation of AON domain 16. In the example of iso_en, iso_en is implemented as an active high signal such that it is asserted to a logic level high (i.e. logic level one) and negated to a logic level low (i.e. logic level zero). Also, as used herein, normal operation refers to operation of SoC 10 when fully powered up and not in standby mode (i.e. not in a low power mode).

In one embodiment, isolation circuitry 41 is implemented with logic gates, such as AND gate 42 and OR gate 44), depending on the desired values of the isolated output signals provided to AON domain 16. For example, in the case of an output signal provided by circuit 22, the output can be provided to a first input of AND gate 42 and a signal based on iso_en can be provided to an inverted second input of AND gate 42 such that, when iso_en is negated (during normal operation), AND gate 42 simply passes the value of the output signal from circuit 22 to AON domain 16, and when iso_en is asserted, AND gate 42 masks the output signal from circuit 22, forcing this output signal to be provided as a logic level low (logic level zero) to AON domain 16. In the case of an output signal provided by circuit 24, the output can be provided to a first input of OR gate 44 and the signal based on iso_en can be provided to a second input of OR gate 44 such that, when iso_en is negated (during normal operation), OR gate 44 simply passes the value of the output signal from circuit 24 to AON domain 16, and when iso_en is asserted, OR gate 44 masks the output signal from circuit 24, forcing this output signal to be provided as a logic level high (logic level one) to AON domain 16.

In alternate embodiments, isolation circuit 41 can be implemented with any type and arrangement of logic gates to implement any desired logic function which, when in normal operation, provides the outputs from switchable domain 14 to AON domain 16 without altering the values, and when in standby mode, isolates the outputs from switchable domain 14 from AON domain 16. In the case of isolating the outputs, isolation circuit 41 can force the isolated outputs to be a predetermined logic value (e.g. a logic level one or logic level zero), as needed, to prevent affecting AON domain 16.

In the illustrated embodiment of FIG. 1, iso_en is provided from standby controller 18 through switchable domain 14, to AON domain 16 (via ISO wrapper circuit 20). As these may be located far apart, switchable domain 14 includes a set of buffers 26, 28, and 30 to propagate (i.e. communicate) iso_en so that iso_en does not lose power or degrade before reaching other domains (before reaching ISO wrapper circuit 20). However, when in standby mode, VDD_SW (which is used to power the set of buffers) is powered down, preventing iso_en from being reliably communicated through switchable domain 14 to ISO wrapper circuit 20. This would adversely impact SoC's ability to reliably enter into (or exit from) standby mode. Therefore, in one embodiment, as illustrated in FIG. 1, ISO wrapper circuit 20 includes an ISO latch 40 (also referred to as a pass-through latch) to latch the value of iso_en from switchable domain 14 before power is lost. A pass-through latch operates to transparently pass a signal at its input to its output when enabled, and block any signal at its input from affecting its output when disabled. In the illustrated embodiment, ISO latch 40 is implemented as an asynchronous D latch having a D input, an enable (EN) input, and a Q output, in which the D input is coupled to receive iso_en generated by standby controller 18 and the Q output is coupled to isolation circuitry 41 to provide a signal based on iso_en to isolation circuitry 41. The Q output is provided to the inverted second input of AND gate 42 and the second input of OR gate 44. Note that the EN input of ISO latch 40 is an inverted input, as indicated by the circle on the input.

During normal operation, when fully powered up, latch 40 is enabled (with a logic level zero at the inverted enable input) and operates transparently as a pass through latch which simply provides iso_en received at the D input as the Q output to isolation circuitry 41. That is, when enabled, the value of iso_en provided at the Q output follows the value of iso_en received at the D input via switchable domain 14. When entering standby mode, as VDD_SW is powered down, ISO latch 40 is disabled (when a logic level one is received at the inverted enable input). Once disabled, latch 40 reliably latches (i.e. maintains at the Q output) the last received value of iso_en prior to having been disabled, regardless of how iso_en or at the D input changes. That is, when disabled, ISO latch 40 latches the current value at the D input and blocks the D input from affecting the Q output. The EN input of ISO latch 40 is controlled by a voltage level detector such as SPD 32 of switchable domain 14.

Note that typically, in each physical partition of SoC 10 (and therefore in each switchable domain), an SPD is available to detect the presence of a voltage on its voltage supply terminal. Therefore, switchable domain 14 includes SPD 32 which detects the presence of VDD_SW on the power supply terminal configured to receive VDD_SW. When SPD 32 detects a voltage on the power supply terminal that is greater than a predetermined voltage threshold, SPD 32 asserts its output, SPD_OUT, on conductor 34 to a logic level one, to indicate that VDD_SW is sufficiently powered up to power the circuitry (e.g. logic) of switchable domain 14. When sufficiently powered, circuits such as circuits 22 and 24, buffers 26, 28, and 30, and SPD 32 itself are capable of operating normal to reliably perform their desired functions. When VDD_SW falls below the predetermined voltage threshold, such as while being powered down for entry into standby mode, SPD 32 negates SPD_OUT to a logic level zero. Note that the predetermined voltage threshold of SPD 32 is set to a voltage that is higher than a threshold voltage required for proper operation of the logic within switchable domain 14.

Figure 2:
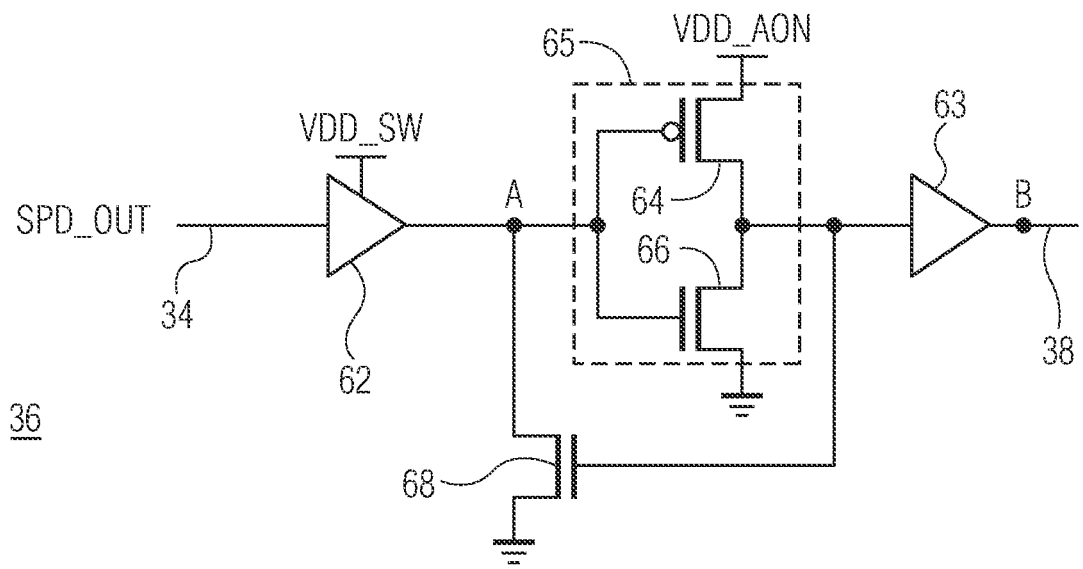
FIG. 2 illustrates, in schematic form, a half latch keeper within an AON domain of FIG. 1, in accordance with an embodiment of the present invention.
Figure 3:
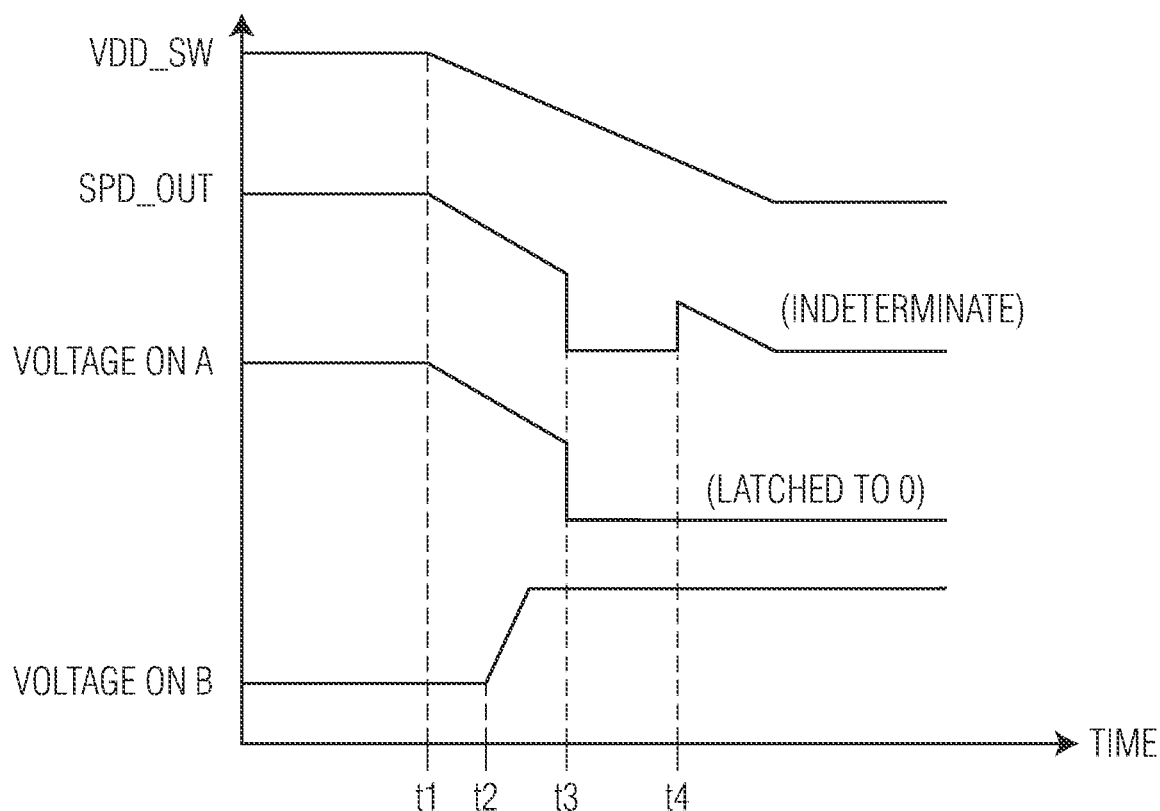
FIG. 3 illustrates waveforms of various signals in the half latch keeper of FIG. 2, in accordance with an embodiment of the present invention.

ISO wrapper circuit 20 includes a half latch keeper 36 which is configured to receive SPD_OUT from SPD 32 and provides an output via conductor 38 to the inverted enable input of latch 40. Since the enable input is inverted, note that a logic level zero on conductor 38 enables latch 40 such that it operates as a pass through latch, and a logic level one on conductor 38 disables latch 40 such the value at the D input no longer affects the Q output. Half latch keeper 36 is configured to safe state SPD_OUT to a logic level zero when VDD_SW falls to 0V and also limits the switching current when power is transitioned between being on and off. Operation of SPD 32, half latch keeper 36, and ISO latch 40 will be described in more detail in reference to FIGS. 2 and 3, in which FIG. 2 illustrates a more detailed view of half latch keeper 36 and FIG. 3 illustrates example waveforms of various signals within or used by half latch keeper 36. (Note that half latch keeper 36 may simply be referred to as keeper 36.)

In the illustrated embodiment of FIG. 2, keeper 36 includes a buffer 62 powered by VDD_SW, a buffer 63 powered by VDD_AON, an inverter 65 powered by VDD_AON, and an n-type transistor 68 (also referred to as a feedback transistor). Buffer 62 is coupled to conductor 34 to receive SPD_OUT, and has an output coupled to a circuit node A. Inverter 65 includes an input coupled to node A and an output coupled to an input of buffer 63. An output of buffer 63 is coupled to a circuit node B at conductor 38. Inverter 65 includes a p-type transistor 64 having a first current electrode coupled to VDD_AON, a gate electrode coupled to node A, and a second current electrode coupled to the input of buffer 63, and an n-type transistor 66 having a first current electrode coupled to the second current electrode of transistor 64, a control electrode coupled to node A, and a second current electrode coupled to ground. Transistor 68 has a first current electrode coupled to node A, a control electrode coupled to the input of buffer 63, and a second current electrode coupled to ground.

In operation, when VDD_SW is sufficiently powered up, buffer 62 provides SPD_OUT to the input of inverter 65 at node A. Inverter 65, which is always powered, provides an inverted value of node A to the input of buffer 63 which outputs the inverted value at node B. Transistor 68 provides feedback from the output of inverter 65 to node A, such that when VDD_SW is powered down and SPD_OUT assumes the high impedance state (Z), transistor 68 pulls the voltage at node A to ground so that the input of inverter 65 is not the high impedance state. However, transistor 68 is a weak transistor (e.g. implemented with a long channel length) such that it can be easily overridden when VDD_SW is powered up. When VDD_SW is powered up, node B provides an inverted version of SPD_OUT, in which the value at node B controls ISO latch 40. In an alternate embodiment, to avoid crowbar current in the inverter stage when SPD_OUT is less than VDD_AON, transistor 68 can be implemented as a high threshold voltage (Vt) transistor or high voltage device. In this case, the small current introduced is transitional and will be practically invisible to the overall current consumption.

FIG. 3 illustrates waveforms corresponding to various signals of SoC 10, in accordance with one example of SoC 10 entering into standby mode. Upon entry into standby mode, standby controller 18 asserts iso_en, at which point, VDD_SW is still fully powered and SPD_OUT is asserted due to the presence still of VDD_SW, as illustrated just before time t1 of FIG. 3. Also, just before time t1, the voltage on node A is at a logic level high at the output of buffer 63 and the voltage at node B is at a logic level low (enabling ISO latch 40 to provide the value of iso_en received at its D input as at its Q output to isolation circuitry 41). In response to assertion of iso_en, the power management circuit (which may be located outside of SoC 10) powers down VDD_SW. Therefore, at time t1, VDD_SW begins to fall towards 0V, and since SPD 32 and buffer 62 are powered by VDD_SW, both SPD_OUT and the voltage at node A also start to fall. At time t2, SPD_OUT (and thus the voltage at node A) has fallen below the trip point of inverter 65, causing the voltage at node B to transition to a logic level high (which results in disabling latch 40).

Continuing with FIG. 3, VDD_SW continues to fall until SPD 32 no longer detects the presence of sufficient voltage on the power supply terminal (i.e. VDD_SW has fallen below the predetermined voltage threshold of SPD 32), resulting in negation of SPD_OUT to a logic level zero at time t3. As indicated above, the predetermined voltage threshold of SPD 32 is still above the threshold voltage required for logic to properly operate, therefore, SPD 32 is still capable of reliably outputting a logic level zero. Also at time t3, with the voltage at node B (and the output of inverter 65) at a logic level high, the voltage at node A is latched to zero (i.e. pulled to zero) by transistor 68 to ensure that the input of inverter 65 is driven to zero rather than being in the high impedance state. The voltage at node B being a logic level high also maintains latch 40 as disabled such that the latched asserted value of iso_en (which was provided by latch 40 when VDD_SW was still fully powered) is still provided as the Q output to isolation circuit 41, even as iso_en propagated by the buffers of switchable domain 14 continues to fall due to the fall of VDD_SW. Note that times t2 can also occur later, closer to or coincident with t3, in which node B inverts in response to SPD_OUT going low and not simply by the threshold trip voltage of node A with respect to inverter 65.

VDD_SW continues to fall until, at time t4, VDD_SW has fallen to a level at which SPD 32 can no longer properly operate, at which point SPD_OUT becomes indeterminate. However, since the voltage at node A is maintained by transistor 68 during standby mode at a logic level low, the value at node B is maintained as a logic level high, which protects the value based on iso_en provided by the Q output of latch 40 by preventing (i.e. blocking) the propagated value of iso_en received via the buffers of switchable domain 14 at the D input of latch 40 from affecting the value at the Q output. Therefore, even with VDD_SW powered down (off) and with switchable domain 14 no longer powered, the latched asserted value of iso_en is maintained so as to properly provide isolation of AON domain 16 during standby mode.

During an exit from the standby mode, VDD_SW is powered back up (such as by the power management circuit) while iso_en remains asserted at a logic level high. As VDD_SW is powered back up, the buffers of switchable domain 14 become operatable again, providing the asserted value of iso_en to latch 40, and subsequently, SPD 32 asserts SPD_OUT. The assertion of SPD_OUT results in the output of keeper 36 on conductor 38 being negated to a logic level zero, again enabling ISO latch 40 to provide the value of iso_en received at its D input as its Q output. (Once again, the value at the Q output changes in response to changes in iso_en.) When ISO latch 40 is first re-enabled, iso_en is still asserted by standby controller 18, and once VDD_SW is fully powered, standby controller 18 negates (e.g. releases iso_en) to exist standby mode and latch 40 transparently passes the negated iso_en through to its Q output.

Figure 4:
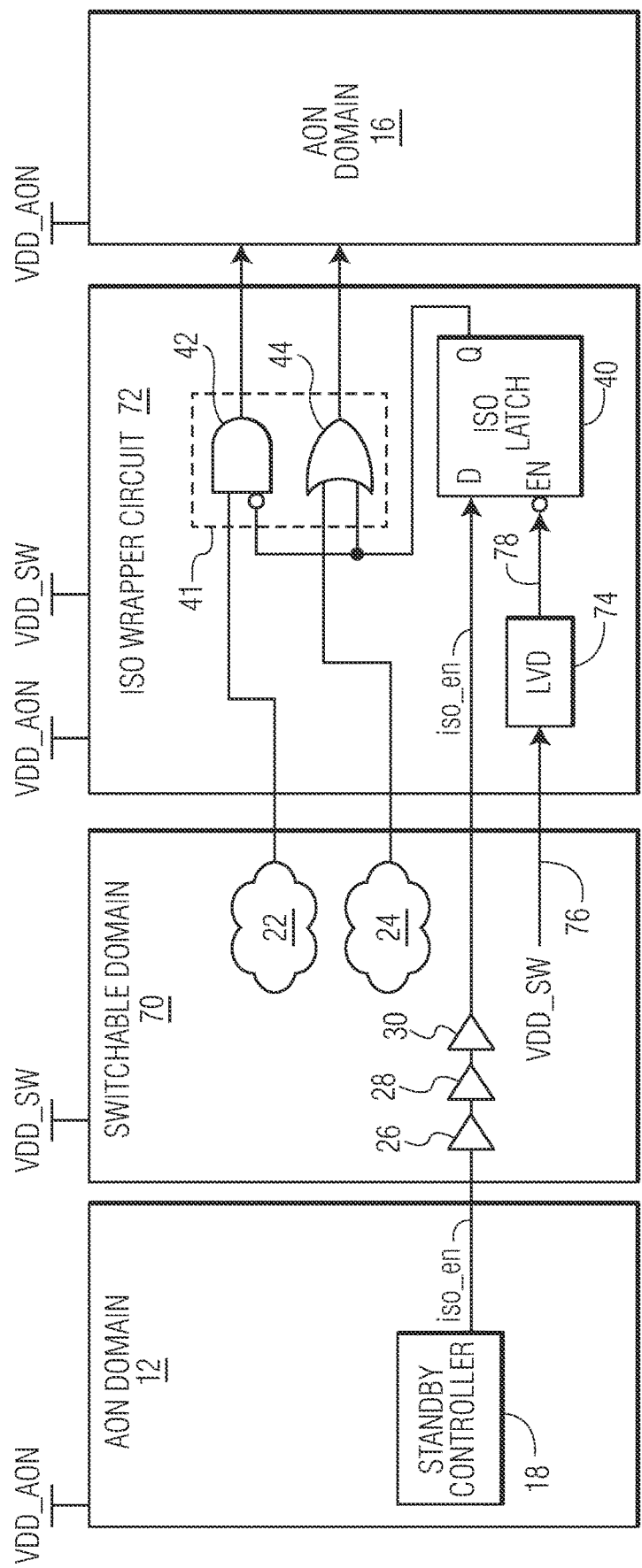
FIG. 4 illustrates, in block diagram form, an SoC having AON domains and a switchable domain, in which an AON domain includes a voltage level detector, in accordance with an embodiment of the present invention.

FIG. 4 illustrates an SoC 100 including AON domains 12 and 16, as described above in reference to FIG. 1. SoC 100 also includes a switchable domain 70, similar to switchable domain 14 of FIG. 1, except without an SPD such as SPD 32. SoC 100 also includes an ISO wrapper circuit 72 coupled to switchable domain 70 and AON domain 16, and operates to isolate signals from switchable domain 70 (e.g. from circuits 22 and 24) from AON domain 16 during standby mode, as was described above in reference to ISO wrapper circuit 20. ISO wrapper circuit 72 includes isolation circuit 41 and ISO latch 40, as was described above, in which ISO latch 40 of ISO wrapper circuit 72 is also controlled by the output of a voltage monitor circuit. However, in the embodiment of FIG. 4, the voltage level detector is implemented as a low voltage detector (LVD) 74, located within ISO wrapper circuit 72 and powered by VDD_AON such that it is always available. Therefore, in the embodiment of FIG. 4, a half latch keeper is not needed because the output of LVD 74, which is provided to the inverted enable of ISO latch 40 via conductor 78 is always available, even when VDD_SW is powered down for standby mode.

LVD 74 continuously monitors VDD_SW (via a conductor 76 coupled to the power supply terminal of switchable domain 70), and the output of LVD 74 is asserted to a logic level one when VDD_SW falls below a predetermined voltage threshold of LVD 74 and is negated to a logic level zero otherwise. Therefore, when VDD_SW is fully powered during normal operation, the output of LVD 74 is negated, thus enabling ISO latch 40 to provide the value of iso_en received at its D input as its Q output to isolation circuit 41. During standby mode, though, the output of LVD 74 is asserted, disabling ISO latch 40 in which the value at the Q output is maintained as the latched value of iso_en, regardless of any changes in iso_en at the D input received via switchable domain 70. The predetermined voltage threshold of LVD 74 is set to a voltage that is higher than a minimum supply voltage required for logic gates to operate. In this manner, as VDD_SW falls, the value of iso_en at the D input of ISO latch 40 is still stable when the output of LVD 74 is asserted (because buffers 26, 28, and 30 are still operational until VDD_SW falls below the minimum threshold required for logic gates to operate). By the time that VDD_SW falls below the minimum threshold required for logic gates to operate, ISO latch 40 will already be disabled so as to provide the latched value of iso_en to isolation circuit 41 (and thus not be affected by changes in iso_en at the D input).

Note that, in alternate embodiments, different logic (including one or more logic gates) can be used to implement the functionality of ISO latch 40. For example, ISO latch 40 can instead by implemented by an ISO OR gate, in which a first input of the OR gate is coupled to receive iso_en from the buffers of switchable domain 14, a second input (corresponding to an enable input) receives the output of keeper 36 (in the embodiment of FIG. 1) or the output of LVD 74 (in the embodiment of FIG. 4), and an output of the ISO OR gate is provided to isolation circuit 41. In this example, the latch is enabled when the second input to the OR gate is a logic level zero such that the output of the OR gate follows changes in value at the first input (thus transparently passing the value at the first input to the output), and the latch is disabled when the second input to the OR gate is a logic level one. When disabled, the output of the OR gate is latched at a logic level high and is not affected by changes in value at the first input of the OR gate (thus blocking values at the first input from affecting the output). In other embodiments, ISO latch 40 can be implemented by one or more gates which result in a logic level low being provided at the output when disabled rather than a logic level high, depending on the logic design of isolation circuit 41.

Although only one ISO wrapper circuit is illustrated in FIGS. 1 and 4, which isolates signals from AON domain 16, each AON domain of the SoC may have a corresponding ISO wrapper circuit similar to those illustrated in FIG. 1 or 4. In this manner, AON domain 12 with standby controller 18 can be located anywhere within the SoC, and the isolation signals can be properly communicated to any other AON domain or wrapper circuit as needed. Note that the ISO wrapper circuit, which can receive both VDD_AON and VDD_SW may be considered to be a portion of an AON domain (e.g., ISO wrapper circuit 20 or 72 may be considered to be a portion of AON domain 16). Each AON domain may therefore have a corresponding ISO wrapper circuit with an isolation circuit.

Figure 5:
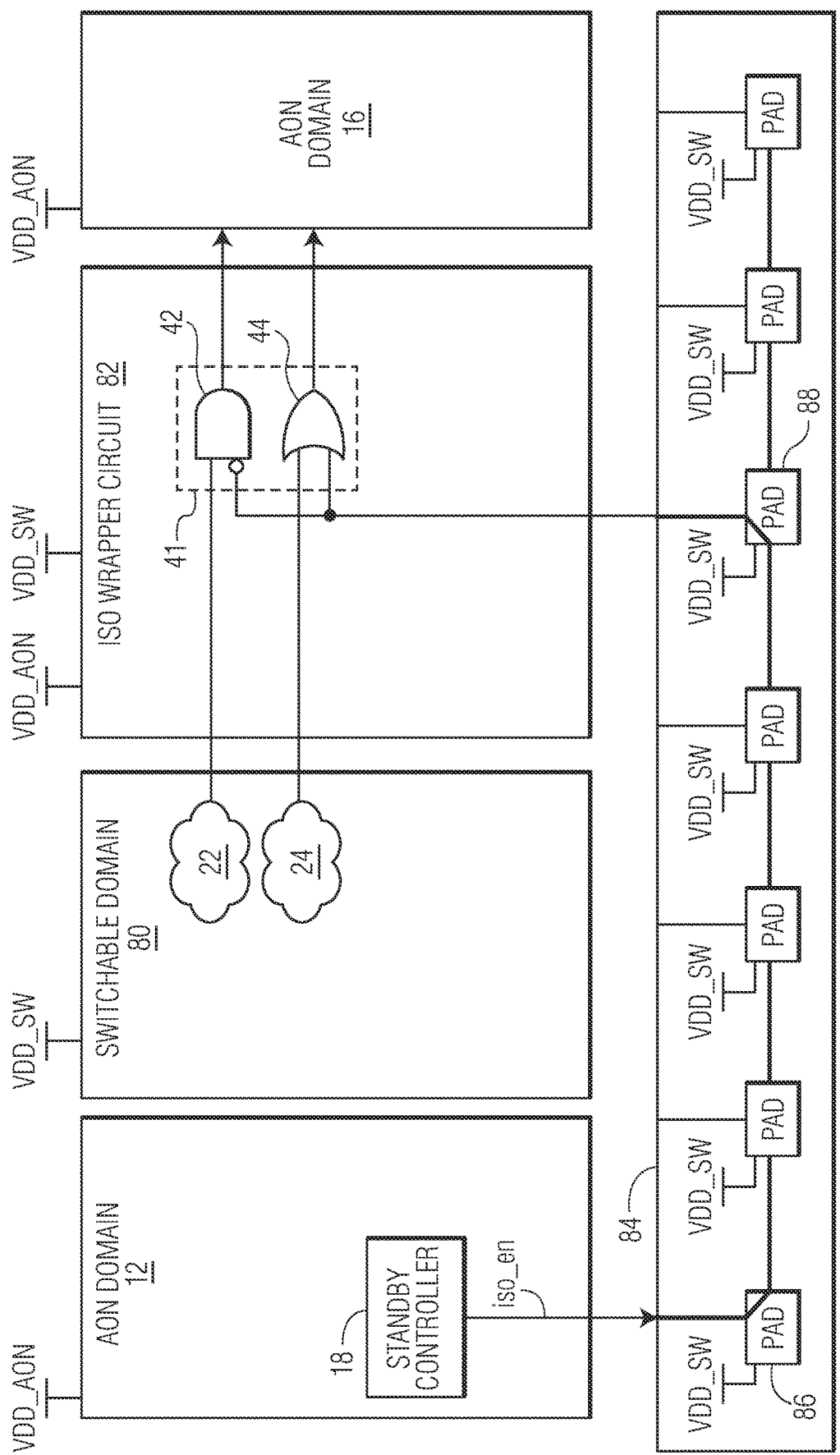
FIG. 5 illustrates, in block diagram form, an SoC having AON domains, a switchable domain, and a padring, in accordance with one embodiment of the present invention.

FIG. 5 illustrates an SoC 104 including AON domains 12 and 16, as described above in reference to FIG. 1. SoC 104 also includes a switchable domain 80, similar to switchable domain 14 of FIG. 1. Switchable domain 80 may or may not include an SPD such as SPD 32. SoC 104 also includes an ISO wrapper circuit 82 coupled to switchable domain 80 and AON domain 16, and operates to isolate signals from switchable domain 80 (e.g. from circuits 22 and 24) from AON domain 16 during standby mode, as was described above in reference to ISO wrapper circuit 20. ISO wrapper circuit 82 includes isolation circuit 41, as was described above, in which isolation circuit 41 receives a signal based on iso_en from a padring 84 of SoC 104 rather than from a voltage level detector. Padring 84 is formed around the AON and switchable domains, typically at edges of SoC 104, as known in the art. Therefore, padring 84 at least partially surrounds AON and the switchable power domains, as well as the corresponding wrapper circuits Padring 84 includes any number of pad circuits, such as pad circuits 86 and 88, in which each pad of a pad circuit can be an input pad, an output pad, or input/output pad. The pad circuits are used to communicate signals between SoC 104 and external circuitry. Therefore, a pad circuit includes a corresponding pad as well as any circuitry required for operating the corresponding pad as an input pad, an output pad, or an input/output pad. In the illustrated embodiment, a plurality of the pad circuits in padring 84, such as pad circuits 86 and 88, are powered by VDD_SW.

Padring 84 typically includes spare lines which are connect between pad circuits but are not used by the pad circuits to implement the input or output functions of the pad. In one embodiment, iso_en provided by standby controller 18 is provided to a nearby pad circuit, e.g. pad circuit 86. The spare signals between adjacent pad circuits are used to communicate (i.e. propagate) the iso_en signal to ISO wrapper circuit 82. For example, the spare lines along a path of immediately adjacent pad circuits, such as those between pad circuit 86 and pad circuit 88, are used to communicate iso_en in which pad circuit 88 provides the iso_en signal to ISO wrapper circuit 82. Since signals within the padring include minimal noise, a clean version of iso_en can be provided from standby controller as needed, to other domains and wrapper circuits. Note that with the use of padring 84 to communicate iso_en, isolation signals from standby controller 18 are not routed through switchable domain 80. Therefore, buffers within switchable domain 80 are not needed to communicate or propagate iso_en, and also, a voltage level detector nor ISO latch are needed for operation of isolation circuit 41.

Figure 6:
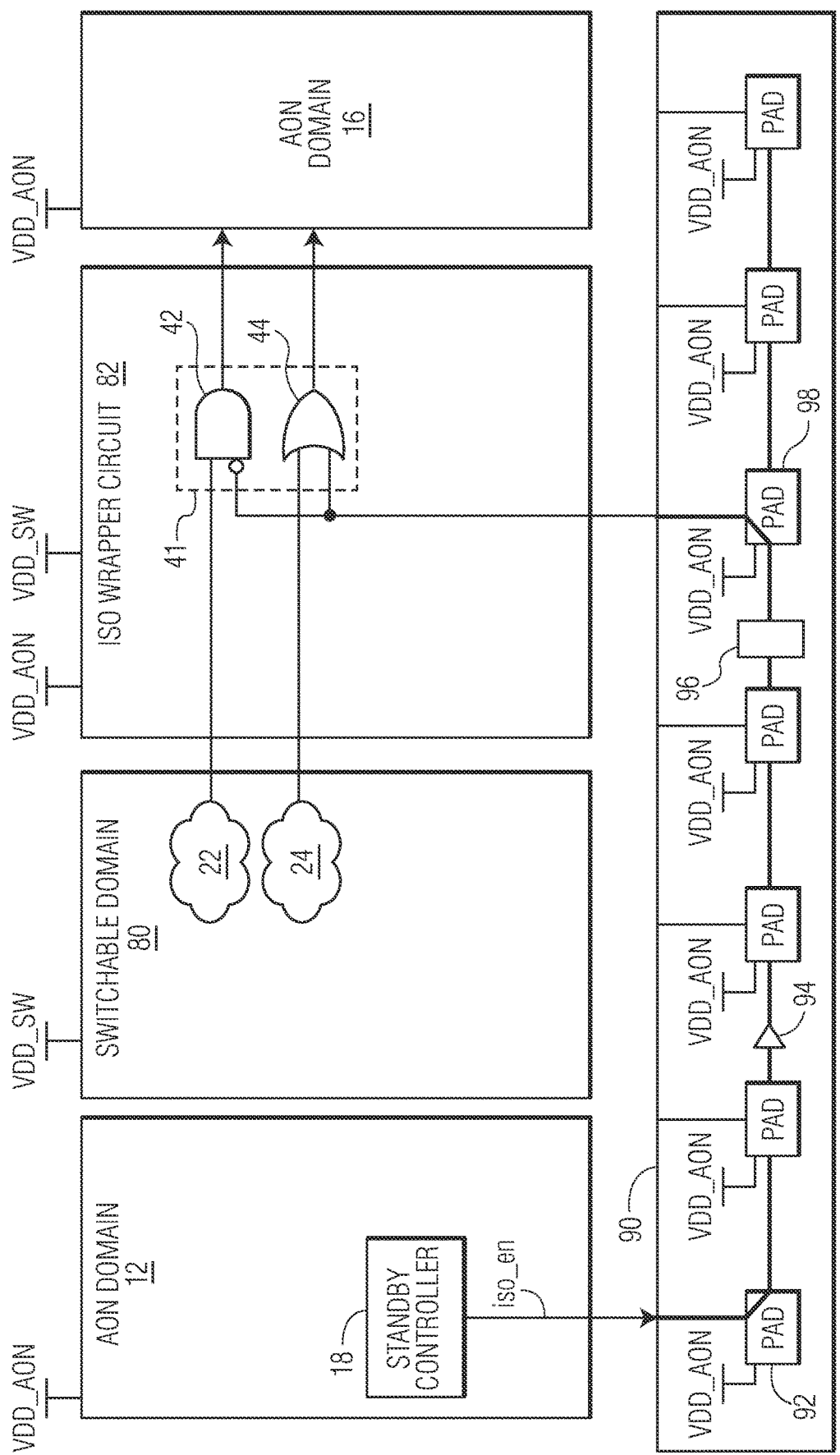
FIG. 6 illustrates, in block diagram form, an SoC having AON domains, a switchable domain, and a padring, in accordance with one embodiment of the present invention

FIG. 6 illustrates an SoC 106 which is similar to SoC 104 of FIG. 5, in which the isolation signals from standby controller 18 are communicated (i.e. propagated) via spare lines of the padring. However, padring 90 of SoC 106 differs from padring 84. The pad circuits of padring 90 (such as pad circuits 92 and 98) are each powered by VDD_AON rather than VDD_SW. In the illustrated embodiment, iso_en is communicated via spare lines of immediately adjacent pad circuits between pad circuits 92 and 98, in which pad circuit 98 provides iso_en to isolation circuit 41. In one embodiment, padring 90 includes a buffer 94 inserted between adjacent pad circuits, as needed, to further buffer iso_en as needed. In another embodiment, a spacer cell 96 with buffers is included between adjacent pad circuits to further buffer iso_en as needed. Note that buffers and spacer cells with buffers can also be used in alternate embodiments of padring 84 of FIG. 5. Alternatively, only buffers or spacer cells may be used within a padring (rather than having both buffer 94 and spacer cell 96). In yet another embodiment, rather than routing isolation signals through pads of the padring of the SoC, they can be routed through the package substrate of the SoC, external to the die, by pads which are powered by VDD_AON.

Therefore, by now it can be appreciated how isolation signals from a standby controller can be routed to various domains of an SoC, without requiring the isolation signals being routed through only AON domains or with numerous buffers. This can be done, for example, through the use of a voltage level detector which controls an isolation latch that can capture and latch the proper value of an isolation signal before the switchable power is removed. The latched value of the isolation signal is therefore available during standby to control isolation circuitry which properly isolates output signals from switchable domains so that they do not adversely affect AON domains. The isolation circuitry can be located, for example, in a corresponding isolation wrapper circuit of each AON domain.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, each SoC can be implemented using different architectures and different partitioning and layouts of switchable domains and AON domains.

Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the functionality of the voltage level detectors, ISO latch, and isolation circuits can be performed using different circuits, with different elements and layouts. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, an integrated circuit has multiple power domains including at least two always on (AON) power domain and a switchable power domain, wherein the switchable power domain is configured to receive a switchable power supply which is powered down during a standby mode and each AON domain is configured to receive a continuous power supply which is not powered down during standby mode. In this embodiment, the integrated circuit includes a first AON power domain having a standby controller configured to control entry into standby mode by generating an isolation signal; a switchable power domain configured to propagate the isolation signal; a voltage level detector having an input configured to receive the switchable power supply and an output configured to provide an indicator which indicates whether a voltage of the switchable power supply is above or below a voltage threshold; a second AON power domain, spaced apart from the first AON power domain; and an isolation wrapper circuit. The isolation wrapper circuit includes a pass-through latch selectively enabled based on the output of the voltage level detector, the pass-through latch having an input configured to receive the propagated isolation signal and configured to provide a value of the propagated isolation signal at its output while enabled, and maintain a latched value at its output regardless of changes in value of the propagated isolation signal while disabled; and an isolation circuit configured to receive signals from circuitry within the switchable power domain and selectively isolate the received signals from the second AON power domain based on the output of the pass-through latch. In one aspect, the latched value corresponds to a last value of the propagated isolation signal prior to the pass-through latch being disabled. In a further aspect, the pass-through latch comprises a D latch. In another aspect of the embodiment, the latched value corresponds to a predetermined logic value. In a further aspect, the pass-through latch includes one or more logic gates configured to provide the predetermined logic value when disabled. In another aspect, the pass-through latch is enabled while the voltage of the switchable power supply is above the voltage threshold and disabled otherwise. In a further aspect, the voltage level detector includes a low voltage detector (LVD) in the AON power domain, configured to be powered by the continuous power supply, and configured to assert its indicator when the voltage of the switchable power supply is below the voltage threshold. In another further aspect, the switchable power domain is configured to propagate the isolation signal with circuitry configured to be powered by the switchable power supply. In another further aspect, the voltage level detector includes a supply power detector (SPD) in the switchable power domain, configured to be powered by the switchable power supply, and configured to assert its indicator when the voltage of the switchable power supply is above the voltage threshold. In yet a further aspect, the AON power domain further includes a keeper circuit having an input coupled to the output of the SPD configured to maintain its output at a logic value corresponding to a negated value of the indictor, wherein an inverter of the keeper circuit is configured to be powered by the continuous power supply. In yet an even further aspect, an input of the inverter is coupled to receive the indicator and an output of the inverter is configured to selectively enable the pass-through latch, in which the SPD further includes a feedback transistor having a current electrode coupled to the input of the inverter and a control electrode coupled to the output of the inverter. In yet another aspect, the isolation circuit selectively isolates the received signals in response to the pass-through latch being disabled so as to prevent the received signals from affecting the second AON power domain during standby mode. In another aspect, the voltage threshold of the voltage level detector is greater than a minimum voltage required for logic to operate.

In another embodiment, an integrated circuit has multiple power domains including at least two always on (AON) power domain and a switchable power domain, wherein the switchable power domain is configured to receive a switchable power supply which is powered down during a standby mode and each AON domain is configured to receive a continuous power supply which is not powered down during standby mode. In this another embodiment, the integrated circuit includes a first AON power domain having a standby controller configured to control entry into standby mode by generating an isolation signal; a switchable power domain comprising a supply power detector (SPD) and configured to propagate the isolation signal, wherein the SPD has an input configured to receive the switchable power supply and is configured to assert an indicator when a voltage of the switchable power supply is above a voltage threshold; a second AON power domain, spaced apart from the first AON power domain; and an isolation wrapper circuit. The isolation wrapper circuit includes a pass-through latch having an input configured to receive the propagated isolation signal, an enable input coupled to receive a signal based on the indicator, and an output configured to provide a value of the received propagated isolation signal when the pass-through latch is enabled and configured to provide a latched value of the isolation signal regardless of changes in value of the received propagated isolation signal when the pass-through latch is disabled; and an isolation circuit configured to receive signals from circuitry within the switchable power domain and selectively isolate the received signals from the second AON power domain based on the output of the pass-through latch so as to prevent the received signals from affecting the second AON power domain during standby mode. In one aspect of the another embodiment, the latched value of the isolation signal corresponds to a last value of the propagated isolation signal prior to the pass-through latch being disabled. In a further aspect, the AON power domain further includes a keeper circuit, in which the keeper circuit includes an inverter having an input coupled to receive the indicator from the SPD and an output coupled to the enable input of the pass-through latch, wherein the inverter is configured to be powered by the continuous power supply; and a feedback transistor having a current electrode coupled to the input of the inverter and a control electrode coupled to the output of the inverter. In another further aspect, the switchable power domain is configured to propagate the isolation signal via a set of buffers, each buffer configured to be powered by the switchable power supply.

In yet another embodiment, an integrated circuit has multiple power domains including at least two always on (AON) power domain and a switchable power domain, wherein the switchable power domain is configured to receive a switchable power supply which is powered down during a standby mode and each AON domain is configured to receive a continuous power supply which is not powered down during standby mode. In this yet another embodiment, the integrated circuit includes a first AON power domain having a standby controller configured to control entry into standby mode by generating an isolation signal; a switchable power domain; a second AON power domain, spaced apart from the first AON power domain; a padring at least partially surrounding the first AON power domain, the switchable power domain, the second AON power domain, wherein the padring comprises a plurality of pad circuits having spare lines coupled between adjacent pad circuits, wherein the padring is configured to propagate the isolation signal via the spare lines of at least two or more adjacent pad circuits; and an isolation wrapper circuit comprising an isolation circuit configured to receive signals from circuitry within the switchable power domain and selectively isolate the received signals from the second AON power domain based on the propagated isolation signal from the at least two or more adjacent pad circuits so as to prevent the received signals from affecting the second AON power domain during standby mode. In one aspect, the integrated circuit further includes a buffer coupled along a spare line between a first pad circuit and a second pad circuit of the at least two or more adjacent pad circuits to propagate the isolation signal. In another aspect, the integrated circuit further includes a spacer cell coupled between a first pad circuit and a second pad circuit of the at least two or more adjacent pad circuits.

What is claimed is:

1. An integrated circuit having multiple power domains including at least two always on (AON) power domains and a switchable power domain, wherein the switchable power domain is configured to receive a switchable power supply which is powered down during a standby mode and each AON domain is configured to receive a continuous power supply which is not powered down during the standby mode, the integrated circuit comprising:
    a first AON power domain of the at least two AON power domains having a standby controller configured to control entry into standby mode by generating an isolation signal;
    the switchable power domain configured to propagate the isolation signal;
    a voltage level detector having an input configured to receive the switchable power supply and an output configured to provide an indicator which indicates whether a voltage of the switchable power supply is above or below a voltage threshold;
    a second AON power domain of the at least two AON power domains, spaced apart from the first AON power domain; and
    an isolation wrapper circuit comprising:
        a pass-through latch selectively enabled based on the output of the voltage level detector, the pass-through latch having an input configured to receive the propagated isolation signal and configured to:
            provide a value of the propagated isolation signal at its output while enabled, and
            maintain a latched value at its output regardless of changes in value of the propagated isolation signal while disabled; and
        an isolation circuit configured to receive signals from circuitry within the switchable power domain and selectively isolate the received signals from the second AON power domain based on the output of the pass-through latch.

2. The integrated circuit of claim 1, wherein the latched value corresponds to a last value of the propagated isolation signal prior to the pass-through latch being disabled.

3. The integrated circuit of claim 2, wherein the pass-through latch comprises a D latch.

4. The integrated circuit of claim 1, wherein the latched value corresponds to a predetermined logic value.

5. The integrated circuit of claim 4, wherein the pass-through latch comprises one or more logic gates configured to provide the predetermined logic value when disabled.

6. The integrated circuit of claim 1, wherein the pass-through latch is enabled while the voltage of the switchable power supply is above the voltage threshold and disabled otherwise.

7. The integrated circuit of claim 6, wherein the voltage level detector comprises a low voltage detector (LVD) in the isolation wrapper circuit, configured to be powered by the continuous power supply, and configured to assert its indicator when the voltage of the switchable power supply is below the voltage threshold.

8. The integrated circuit of claim 6, wherein the switchable power domain is configured to propagate the isolation signal with second circuitry configured to be powered by the switchable power supply.

9. The integrated circuit of claim 6, wherein the voltage level detector comprises a supply power detector (SPD) in the switchable power domain, configured to be powered by the switchable power supply, and configured to assert its indicator when the voltage of the switchable power supply is above the voltage threshold.

10. The integrated circuit of claim 9, wherein the AON power domain further comprises a keeper circuit having an input coupled to the output of the SPD configured to maintain its output at a logic value corresponding to a negated value of the indictor, wherein an inverter of the keeper circuit is configured to be powered by the continuous power supply.

11. The integrated circuit of claim 10, wherein an input of the inverter is coupled to receive the indicator and an output of the inverter is configured to selectively enable the pass-through latch, the SPD further comprising:
   a feedback transistor having a current electrode coupled to the input of the inverter and a control electrode coupled to the output of the inverter.

12. The integrated circuit of claim 1, wherein the isolation circuit selectively isolates the received signals in response to the pass-through latch being disabled so as to prevent the received signals from affecting the second AON power domain during the standby mode.

13. The integrated circuit of claim 1, wherein the voltage threshold of the voltage level detector is greater than a minimum voltage required for logic to operate.

14. An integrated circuit having multiple power domains including at least two always on (AON) power domains and a switchable power domain, wherein the switchable power domain is configured to receive a switchable power supply which is powered down during a standby mode and each AON domain is configured to receive a continuous power supply which is not powered down during the standby mode, the integrated circuit comprising:
   a first AON power domain of the at least two AON power domains having a standby controller configured to control entry into standby mode by generating an isolation signal;
   the switchable power domain comprising a supply power detector (SPD) and configured to propagate the isolation signal, wherein the SPD has an input configured to receive the switchable power supply and is configured to assert an indicator when a voltage of the switchable power supply is above a voltage threshold;
   a second AON power domain of the at least two AON power domains, spaced apart from the first AON power domain; and
   an isolation wrapper circuit comprising:
      a pass-through latch having an input configured to receive the propagated isolation signal, an enable input coupled to receive a signal based on the indicator, and an output configured to provide a value of the received propagated isolation signal when the pass-through latch is enabled and configured to provide a latched value of the isolation signal regardless of changes in value of the received propagated isolation signal when the pass-through latch is disabled; and
      an isolation circuit configured to receive signals from circuitry within the switchable power domain and selectively isolate the received signals from the second AON power domain based on the output of the pass-through latch so as to prevent the received signals from affecting the second AON power domain during standby mode.

15. The integrated circuit of claim 14, wherein the latched value of the isolation signal corresponds to a last value of the propagated isolation signal prior to the pass-through latch being disabled.

16. The integrated circuit of claim 15, wherein the the isolation wrapper circuit further comprises a keeper circuit, the keeper circuit comprising:
   an inverter having an input coupled to receive the indicator from the SPD and an output coupled to the enable input of the pass-through latch, wherein the inverter is configured to be powered by the continuous power supply; and
   a feedback transistor having a current electrode coupled to the input of the inverter and a control electrode coupled to the output of the inverter.

17. The integrated circuit of claim 15, wherein the switchable power domain is configured to propagate the isolation signal via a set of buffers, each buffer configured to be powered by the switchable power supply.

18. An integrated circuit having multiple power domains including at least two always on (AON) power domains and a switchable power domain, wherein the switchable power domain is configured to receive a switchable power supply which is powered down during a standby mode and each AON domain is configured to receive a continuous power supply which is not powered down during the standby mode, the integrated circuit comprising:
   a first AON power domain of the at least two AON power domains having a standby controller configured to control entry into standby mode by generating an isolation signal;
   the switchable power domain;
   a second AON power domain of the at least two AON power domains, spaced apart from the first AON power domain;
   a padring at least partially surrounding the first AON power domain, the switchable power domain, the second AON power domain, wherein the padring comprises a plurality of pad circuits having spare lines coupled between adjacent pad circuits, wherein the padring is configured to propagate the isolation signal via the spare lines of at least two or more adjacent pad circuits; and
   an isolation wrapper circuit comprising an isolation circuit configured to receive signals from circuitry within the switchable power domain and selectively isolate the received signals from the second AON power domain based on the propagated isolation signal from the at least two or more adjacent pad circuits so as to prevent the received signals from affecting the second AON power domain during standby mode.

19. The integrated circuit of claim 18, further comprising a buffer coupled along a spare line between a first pad circuit and a second pad circuit of the at least two or more adjacent pad circuits to propagate the isolation signal.

20. The integrated circuit of claim 18, further comprising a spacer cell coupled between a first pad circuit and a second pad circuit of the at least two or more adjacent pad circuits.

* * * * *